US012759654B2

(12) United States Patent
Hwang et al.

(10) Patent No.: US 12,759,654 B2
(45) Date of Patent: Oct. 13, 2026

(54) VEHICLE BODY

(71) Applicants: HYUNDAI MOTOR COMPANY, Seoul (KR); KIA CORPORATION, Seoul (KR)

(72) Inventors: Jin Ho Hwang, Cheonan-si (KR); Sang Heon Lee, Seoul (KR); Dong Eun Cha, Hwaseong-si (KR); Jae Seung Lee, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 295 days.

(21) Appl. No.: 18/606,305

(22) Filed: Mar. 15, 2024

(65) Prior Publication Data

US 2025/0115317 A1 Apr. 10, 2025

(30) Foreign Application Priority Data

Oct. 10, 2023 (KR) ........................ 10-2023-0134483

(51) Int. Cl.

| | |
|---|---|
| ***B62D 24/00*** | (2006.01) |
| ***B62D 21/09*** | (2006.01) |
| ***B62D 27/06*** | (2006.01) |
| ***B62D 33/077*** | (2006.01) |
| ***B62D 63/02*** | (2006.01) |
| ***G01R 33/02*** | (2006.01) |
| ***H01F 7/08*** | (2006.01) |

(52) U.S. Cl.

CPC ........... *B62D 63/025* (2013.01); *B62D 21/09* (2013.01); *B62D 24/00* (2013.01); *B62D 27/06* (2013.01); *B62D 33/077* (2013.01); *G01R 33/02* (2013.01); *H01F 7/081* (2013.01)

(58) Field of Classification Search

CPC ...... B62D 63/025; B62D 24/00; B62D 24/02; B62D 21/09; B62D 27/06; B62D 33/077

USPC ................................................ 296/35.3, 35.1

See application file for complete search history.

(56) References Cited

U.S. PATENT DOCUMENTS 4,489,977 A * 12/1984 Earing, Jr. ................ B60P 3/42 296/183.1
7,849,601 B2 12/2010 Hedderly
(Continued)

FOREIGN PATENT DOCUMENTS

CN 114313010 A 4/2022
CN 114684273 A 7/2022
(Continued)

*Primary Examiner* — Roger L Pang
(74) *Attorney, Agent, or Firm* — MCDONNELL BOEHNEN HULBERT & BERGHOFF LLP

(57) ABSTRACT

A vehicle body includes a floor frame configured to allow driving parts of a vehicle and wheels thereof to be mounted thereon, a fixed interior part mounted on the floor frame and fixed thereto, a swappable interior part having a lower portion detachably mounted on the floor frame and one side detachably mounted on the fixed interior part, wherein the swappable interior part is replaceable depending on a purpose of use of the vehicle, and a magnetic module provided between the swappable interior part and the floor frame or between the swappable interior part and the fixed interior part and configured to selectively apply fixing force to the swappable interior part according to a flow of current flowing through a coil.

20 Claims, 15 Drawing Sheets

(56) References Cited

U.S. PATENT DOCUMENTS

| | | | | |
|---|---|---|---|---|
| 7,984,941 | B2 * | 7/2011 | Lorenzo ................ | B62D 39/00 296/35.3 |
| 8,210,603 | B2 | 7/2012 | Favaretto | |
| 9,187,129 | B2 | 11/2015 | Stojkovic | |
| 9,278,596 | B2 | 3/2016 | Hummelt et al. | |
| 9,387,788 | B1 | 7/2016 | Stroup et al. | |
| 9,487,246 | B2 | 11/2016 | Courtright et al. | |
| 9,889,892 | B2 | 2/2018 | Walker et al. | |
| 9,926,017 | B1 | 3/2018 | Hamilton et al. | |
| 10,011,303 | B1 | 7/2018 | Mandalia et al. | |
| 10,160,301 | B2 | 12/2018 | Perlo et al. | |
| 10,173,487 | B2 | 1/2019 | von der Haar et al. | |
| 10,245,994 | B2 | 4/2019 | Delp et al. | |
| 10,421,582 | B2 | 9/2019 | Kilibarda et al. | |
| 10,479,405 | B2 * | 11/2019 | Bauer .................. | B62D 27/065 |
| 10,479,427 | B2 | 11/2019 | Scaringe et al. | |
| 10,683,036 | B2 | 6/2020 | Yamazaki | |
| 11,279,412 | B2 | 3/2022 | Kim et al. | |
| 11,325,658 | B2 | 5/2022 | Hattori | |
| 11,338,864 | B2 | 5/2022 | Carlden | |
| 11,358,429 | B2 | 6/2022 | Slawson et al. | |
| 2017/0261097 | A1 * | 9/2017 | Yamanaka ............... | G05G 5/02 |
| 2021/0122280 | A1 | 4/2021 | Morge et al. | |
| 2021/0331749 | A1 * | 10/2021 | Hwang .................. | B62D 24/00 |
| 2022/0048579 | A1 | 2/2022 | Seo | |
| 2022/0073143 | A1 | 3/2022 | Woo et al. | |
| 2022/0135141 | A1 | 5/2022 | Song | |
| 2022/0177049 | A1 | 6/2022 | Peng et al. | |
| 2022/0194478 | A1 | 6/2022 | Song | |
| 2022/0194482 | A1 | 6/2022 | Song et al. | |
| 2022/0227431 | A1 | 7/2022 | Carlden | |
| 2022/0297778 | A1 * | 9/2022 | Moarefi ............... | B62D 63/025 |
| 2022/0306220 | A1 | 9/2022 | Moarefi et al. | |
| 2022/0315107 | A1 | 10/2022 | Jiang et al. | |
| 2024/0051615 | A1 * | 2/2024 | Hwang ................ | B62D 63/025 |

FOREIGN PATENT DOCUMENTS

| | | | | | |
|---|---|---|---|---|---|
| CN | 114735085 | A | | 7/2022 | |
| CN | 110603187 | B | | 8/2022 | |
| CN | 217100199 | U | | 8/2022 | |
| CN | 115214777 | A | | 10/2022 | |
| EP | 3424803 | B1 | | 4/2020 | |
| EP | 3536584 | B1 | | 7/2021 | |
| EP | 3696054 | B1 | | 8/2022 | |
| EP | 4056943 | A1 | | 9/2022 | |
| GB | 2207096 | A | * | 1/1989 | ........... B62D 63/025 |

* cited by examiner

VEHICLE BODY

CROSS REFERENCE TO RELATED APPLICATIONS

This application claims priority from Korean Patent Application No. 10-2023-0134483, filed on Oct. 10, 2023, in the Korean Intellectual Property Office, the disclosure of which is incorporated herein by reference in its entirety.

BACKGROUND

1. Technical Field

The present disclosure relates to a vehicle body having a space formed behind a first row of seats of a vehicle and configured to be integrally separable and replaceable.

2. Background

Recently, with increasing interest in the environment, people are increasingly interested in an electric vehicle including an electric motor as a power source.

Such an electric vehicle may provide a large interior space similar to a living room in a residential space by taking advantage of the flat floor which is one of characteristics of the electric vehicle. For example, in the case of an autonomous vehicle, a purpose-built vehicle (PBV), and a vehicle provided with three rows of seats, various types of bed seats are proposed so as to allow a passenger to comfortably rest and sleep during travelling of a vehicle. Particularly, in consideration of an increase in independent leisure culture, there is also increasing demand for a vehicle configured to enable a passenger to enjoy camping or traveling while sleeping in the vehicle.

Meanwhile, in order to implement a large interior space and reliably manufacture a purpose-built vehicle, recently, research and development (R&D) has been actively conducted on a type of vehicle formed of a cabin part corresponding to a front part of a vehicle including a first row of seats, in which the cabin part is fixed to a lower frame of the vehicle, and a variable part corresponding to a rear part of the first row seat, that is, a rear part of the vehicle, in which the variable part is detachable from the lower frame of the vehicle.

Accordingly, since the variable part is provided to be detachable from the lower frame, it is necessary that the cabin part and the variable part be reliably attached to each other. In the related art, the cabin part and the variable part are attached to each other through mechanical fixation. However, in the case of mechanical fixation, when the variable part is replaced, additional labor is required to assemble or disassemble the cabin part and the variable part. Accordingly, there is a problem in that deterioration in durability occurs due to frequent assembly and disassembly.

The information disclosed in this Background of the Disclosure section is only for enhancement of understanding of the general background of the disclosure, and should not be taken as an acknowledgement or any form of suggestion that this information forms the related art already known to a person skilled in the art.

SUMMARY

Therefore, the present disclosure has been made in view of the above problems, and it is an object of the present disclosure to provide a vehicle body having a space formed behind a first row of seats of a vehicle and configured to be integrally separable and replaceable.

The objects of the present disclosure are not limited to the above-mentioned objects, and other technical objects not mentioned herein will be clearly understood by those skilled in the art to which the present disclosure pertains from the detailed description of the embodiments.

In accordance with the present disclosure, the above and other objects can be accomplished by the provision of a vehicle body including a floor frame configured to allow driving parts of a vehicle and wheels thereof to be mounted thereon, a fixed interior part mounted on the floor frame and fixed thereto, a swappable interior part having a lower portion detachably mounted on the floor frame and one side detachably mounted on the fixed interior part, wherein the swappable interior part is replaceable depending on a purpose of use of the vehicle, and a magnetic module provided between the swappable interior part and the floor frame or between the swappable interior part and the fixed interior part and configured to selectively apply fixing force to the swappable interior part according to a flow of current flowing through a coil.

The magnetic module may include a permanent magnet and the coil, and an external object in contact with the magnetic module and the permanent magnet may selectively generate a magnetic field according to the flow of the current flowing through the coil, thereby allowing the magnetic module and the external object to be selectively fixed to each other or separated from each other.

The magnetic module may be provided in any one of the swappable interior part and the floor frame, and the other one serving as the external object may be fixed to the magnetic module or separated therefrom.

The magnetic module may be provided in any one of the swappable interior part and the fixed interior part, and the other one serving as the external object may be fixed to the magnetic module or separated therefrom.

The plurality of magnetic modules may be provided to be spaced apart from each other along an edge of the floor frame, the fixed interior part, or the swappable interior part.

The swappable interior part may slide and move, when the lower portion of swappable interior part is loaded on an upper portion of the floor frame, from a loading point to a seating point located ahead of the loading point, and the lower portion of the swappable interior part and the floor frame may be fixed to each other at the seating point through the magnetic module.

The floor frame may have a first guidance pin formed to protrude upwards therefrom, the swappable interior part may have a slot hole provided at the lower portion thereof, wherein the slot hole may be located in an area corresponding to a point having the first guidance pin provided thereat, the first guidance pin may be inserted into the slot hole when the lower portion of the swappable interior part is loaded on the floor frame, the inserted first guidance pin may move along the slot hole when the swappable interior part moves, and movement of the swappable interior part may be prevented when the first guidance pin is caught at a rear end of the slot hole.

The swappable interior part may have a fixed block provided at the lower portion thereof, the floor frame may have a fixed block guide provided in an area corresponding to a point having the fixed block provided thereat, and the fixed block may be loaded on the fixed block guide and move by sliding along the fixed block guide from the loading point to the seating point.

The fixed block guide may have a moving space defined therein and configured to allow the fixed block to be slidable and movable therein, the magnetic module may be provided at a lower portion of the moving space, and the magnetic module may be attached to the fixed block moving to the seating point so as to fix the fixed block.

The fixed block guide may have a side magnetic module provided on a side thereof and located at a predetermined distance from the fixed block guide, and the side magnetic module may be inserted into the fixed block in a width direction of the vehicle when the fixed block is fixed through the magnetic module at the seating point, thereby further fixing the fixed block.

The fixed block guide and the side magnetic module may be provided at the upper portion of the floor frame, the swappable interior part may have an indented portion provided at the lower portion thereof and formed to be indented inwards so as to cover the fixed block guide and the side magnetic module, and the indented portion may have a reinforcing bracket provided on an inner surface thereof.

The side magnetic module may include an attachment part including a permanent magnet and a coil, and a second guidance pin formed to extend in the width direction of the vehicle from a side of the attachment part, the fixed block may have a first through hole formed to penetrate opposite sides thereof, and the second guidance pin of the side magnetic module may be inserted into the first through hole of the fixed block so as to further fix the fixed block.

The fixed block guide may have a second through hole formed on one side of the opposite sides thereof, wherein the side magnetic module is located on the one side, one end of the second guidance pin of the side magnetic module may be located in the second through hole, and the first through hole and the second through hole may be aligned, when the fixed block moves to the seating point, on a same line so as to allow the second guidance pin to be inserted into the first through hole.

The attachment part may move, when the first through hole and the second through hole are aligned on the same line, by magnetic force of the permanent magnet so as to contact the one side of the fixed block guide, and the permanent magnet of the attachment part may selectively generate a magnetic field according to a flow of current flowing through the coil, thereby allowing the fixed block guide and the attachment part to be selectively fixed to each other or separated from each other.

The one side having the second through hole of the fixed block guide formed thereon may have a guidance plate provided thereon, wherein the guidance plate may have one end connected to the one side and configured to cover the second guidance pin of the side magnetic module, and the second guidance pin may move along the guidance plate so as to be inserted into the first through hole.

The one side of the swappable interior part may move toward a pillar member of the fixed interior part when the lower portion of the swappable interior part slides and moves from the loading point to the seating point.

The magnetic module may be provided in any one of the one side of the swappable interior part and the pillar member of the fixed interior part, the other one may have a seating part provided therein and configured to allow the magnetic module to be seated thereon, and the magnetic module may be seated on the seating part when the one side of the swappable interior part moves toward the pillar member of the fixed interior part, thereby allowing the one side of the swappable interior part to be fixed to the pillar member of the fixed interior part.

The magnetic module may have a protrusion formed at an end thereof, wherein the end may be seated on the seating part, the seating part may have an insertion hole formed therein and configured to allow the protrusion to be inserted thereinto, and the protrusion may be inserted into the insertion hole when the one side of the swappable interior part is mounted on the pillar member of the fixed interior part, thereby fixing a seating position of the magnetic module.

The vehicle body may further include a controller connected to the magnetic module and configured to determine whether the magnetic module is fixed between the swappable interior part and the floor frame or between the swappable interior part and the fixed interior part.

The magnetic module may include a magnetic flux sensor, the magnetic flux sensor may measure a magnitude and a direction of magnetic flux flowing through the magnetic module according to the flow of the current flowing through the coil, and the controller may be connected to the magnetic flux sensor and determine, based on information measured by the magnetic flux sensor, whether the magnetic module is fixed.

BRIEF DESCRIPTION OF THE FIGURES

The above and other objects, features and other advantages of the present disclosure will be more clearly understood from the following detailed description taken in conjunction with the accompanying drawings, in which.

DETAILED DESCRIPTION

In describing the embodiments disclosed herein, when it is determined that a detailed description of publicly known techniques to which the disclosure pertains may obscure the gist of the present disclosure, the detailed description will be omitted. Further, it should be understood that the accompanying drawings are merely illustrated to easily describe the embodiments disclosed in this specification, and therefore, the technical idea disclosed in this specification is not limited by the accompanying drawings. Further, it should be noted that the accompanying drawings include all modifications, equivalents, and substitutes that fall within the spirit and technical scope of the present disclosure.

Meanwhile, in the present disclosure, terms such as "first" and/or "second" may be used to describe various components, but the components are not limited by the terms. The terms are used only for the purpose of distinguishing one component from other components.

When one component is referred to as being "connected" or "joined" to another component, the one component may be directly connected or joined to the other component, but it should be understood that other components may be present therebetween. On the other hand, when the one component is referred to as being "directly connected to" or "directly in contact with" the other component, it should be understood that no other components are present therebetween.

In this specification, an expression in a singular form also includes the plural sense, unless clearly specified otherwise in context.

It should be understood that expressions such as "comprise" and "have" in this specification are intended to designate the presence of indicated features, numbers, steps, operations, components, parts, or combinations thereof, but do not exclude the presence or addition of one or more features, numbers, steps, operations, components, parts, or combinations thereof.

In order to control various functions, a controller may include a communication apparatus configured to communicate with another controller or a sensor, a memory configured to store an operating system, a logical command, and input/output information, and one or more processors configured to perform determination, calculation, and the like necessary to control a corresponding function.

Hereinafter, the present disclosure will be described in detail through preferred embodiments thereof with reference to the accompanying drawings. Wherever possible, the same reference numbers will be used throughout the drawings to refer to the same or like parts, and redundant descriptions thereof will be omitted.

First, a vehicle body according to an embodiment of the present disclosure will be described with reference to FIG. 1.

Figure 1:
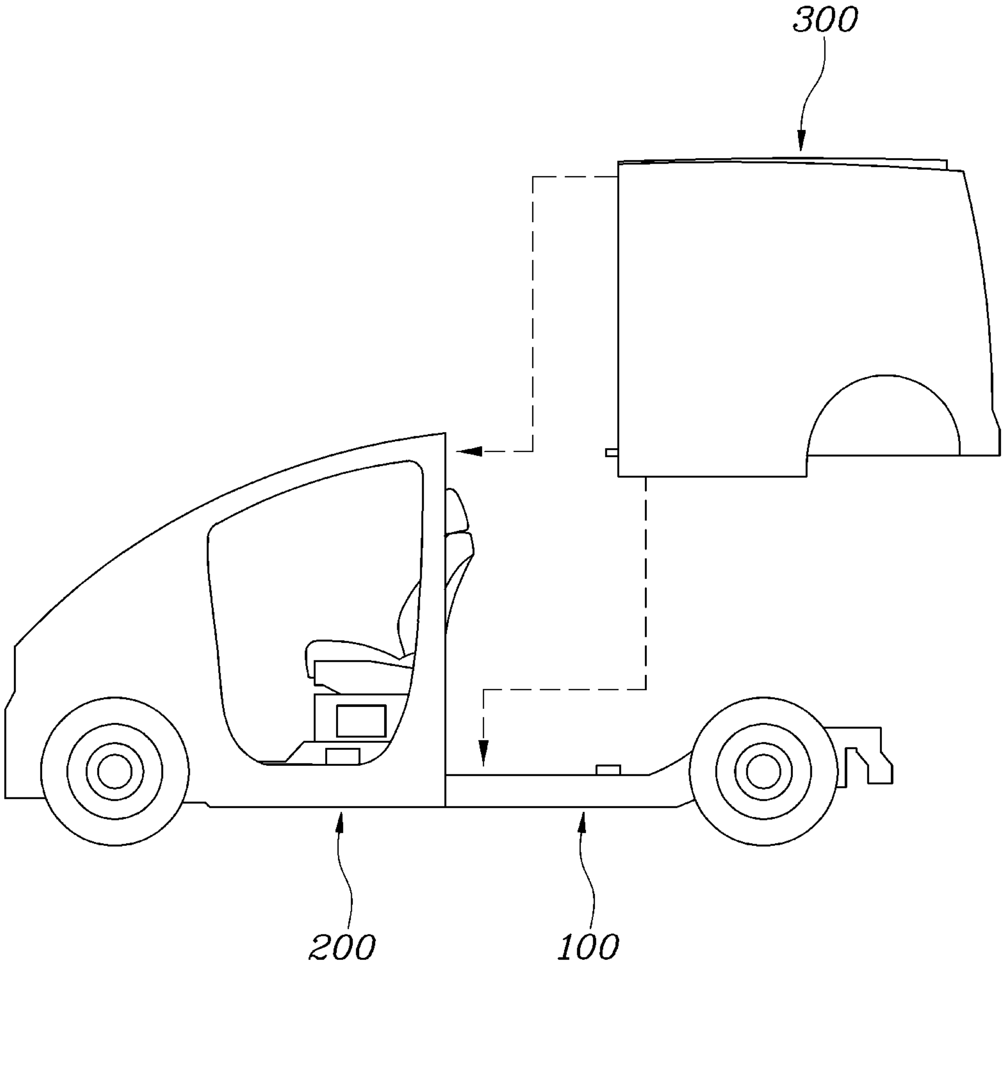
FIG. 1 is a diagram showing a configuration of a vehicle body according to an embodiment of the present disclosure.

FIG. 1 is a diagram showing a configuration of the vehicle body according to the embodiment of the present disclosure.

Referring to FIG. 1, the vehicle body according to the embodiment of the present disclosure may include a floor frame 100, a fixed interior part 200, and a swappable interior part 300.

Referring to FIG. 1, the floor frame 100 may be provided with vehicle driving parts (not shown) and wheels. The fixed interior part 200 may be mounted on to the floor frame 100 and fixed thereto. Further, the swappable interior part 300 has a lower portion detachably mounted on the floor frame 100. Here, one side of the swappable interior part 300 may be detachably mounted on the fixed interior part 200 so that the swappable interior part 300 is replaceable depending on the purpose of use of a vehicle.

In the related art, when the swappable interior part 300 is separated from the floor frame 100 or mounted thereon, a mechanical fixing method is adopted for assembly. However, in the case of mechanical fixing method, additional labor is required when assembly is performed to separate the swappable interior part 300 from the floor frame 100 or mount the swappable interior part 300 thereon. Further, since assembly parts are frequently separated or mounted, there is a problem in that deterioration in durability of assembly parts occurs.

To solve this problem, the vehicle body of the present disclosure may further include a magnetic module 400. The magnetic module 400 may be provided between the swappable interior part 300 and the floor frame 100 or between the swappable interior part 300 and the fixed interior part 200. Here, fixing force may be selectively applied to the swappable interior part 300 according to a flow of current flowing through a coil. The magnetic module 400 will be described in detail with reference to FIGS. 2 to 4.

Figure 2:
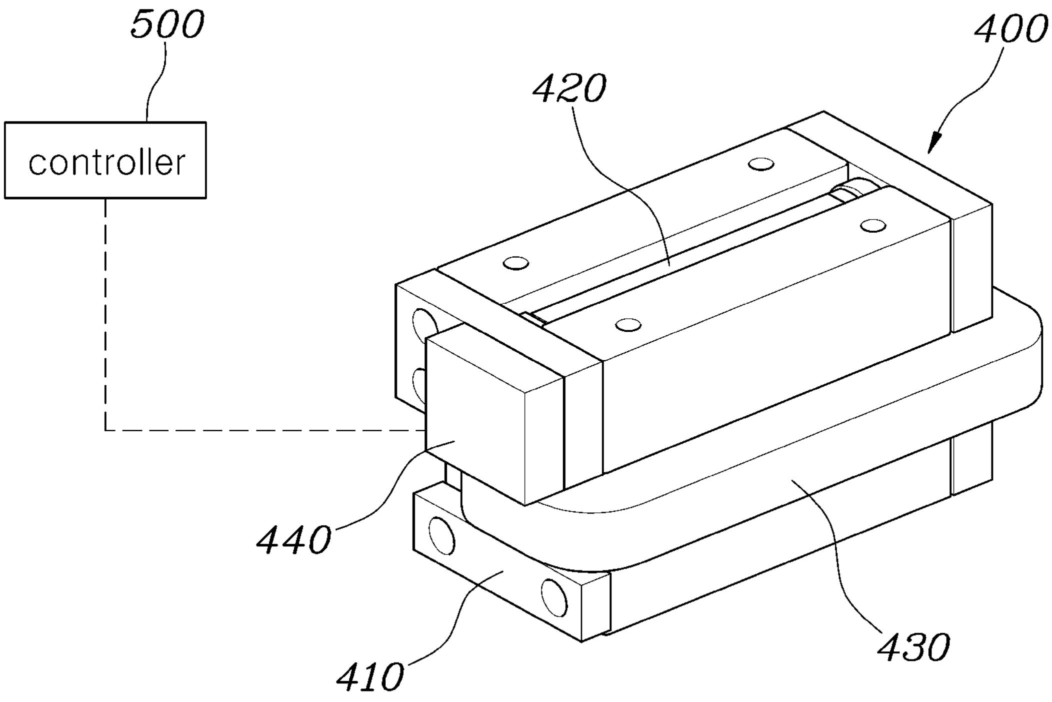
FIG. 2 is a perspective view showing a magnetic module provided in the vehicle body according to the embodiment of the present disclosure.
Figure 3:
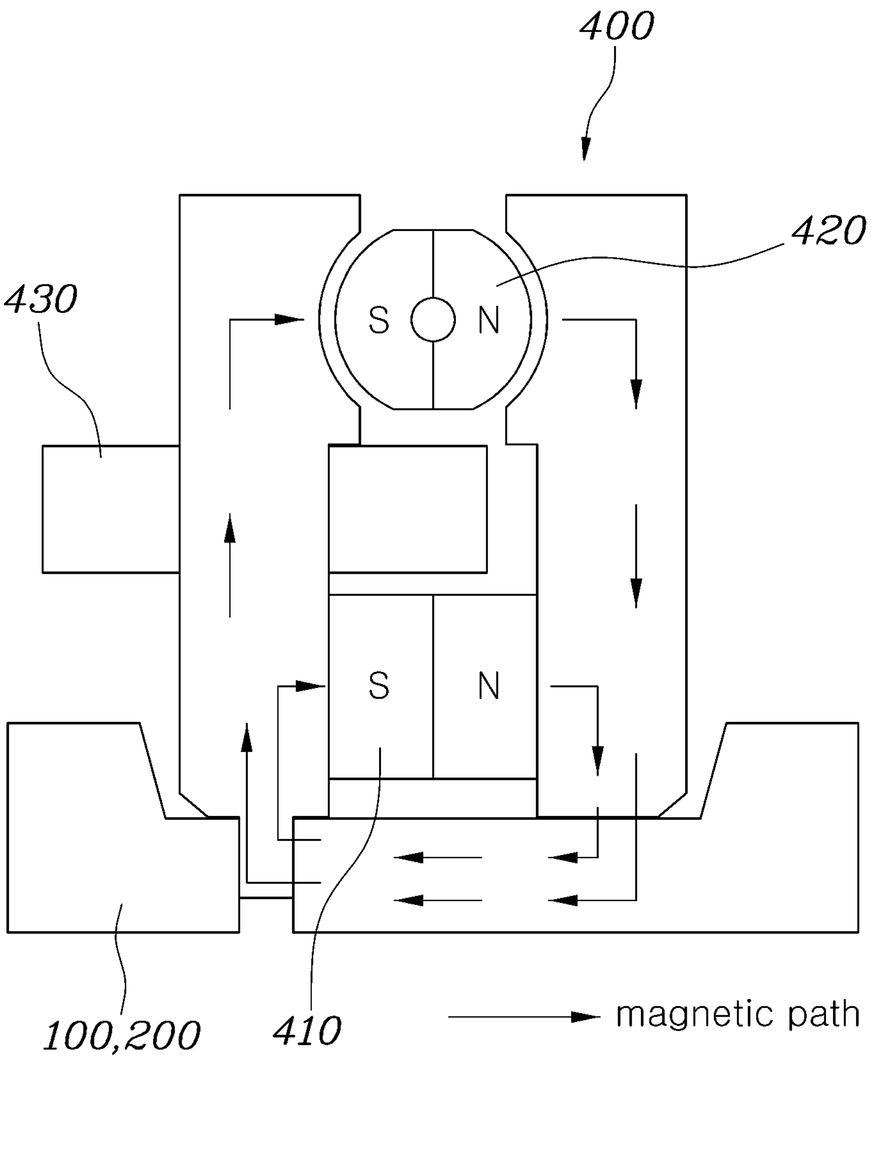
FIGS. 3 and 4 are diagrams showing fixation and separation through the magnetic module according to the embodiment of the present disclosure.
Figure 4:
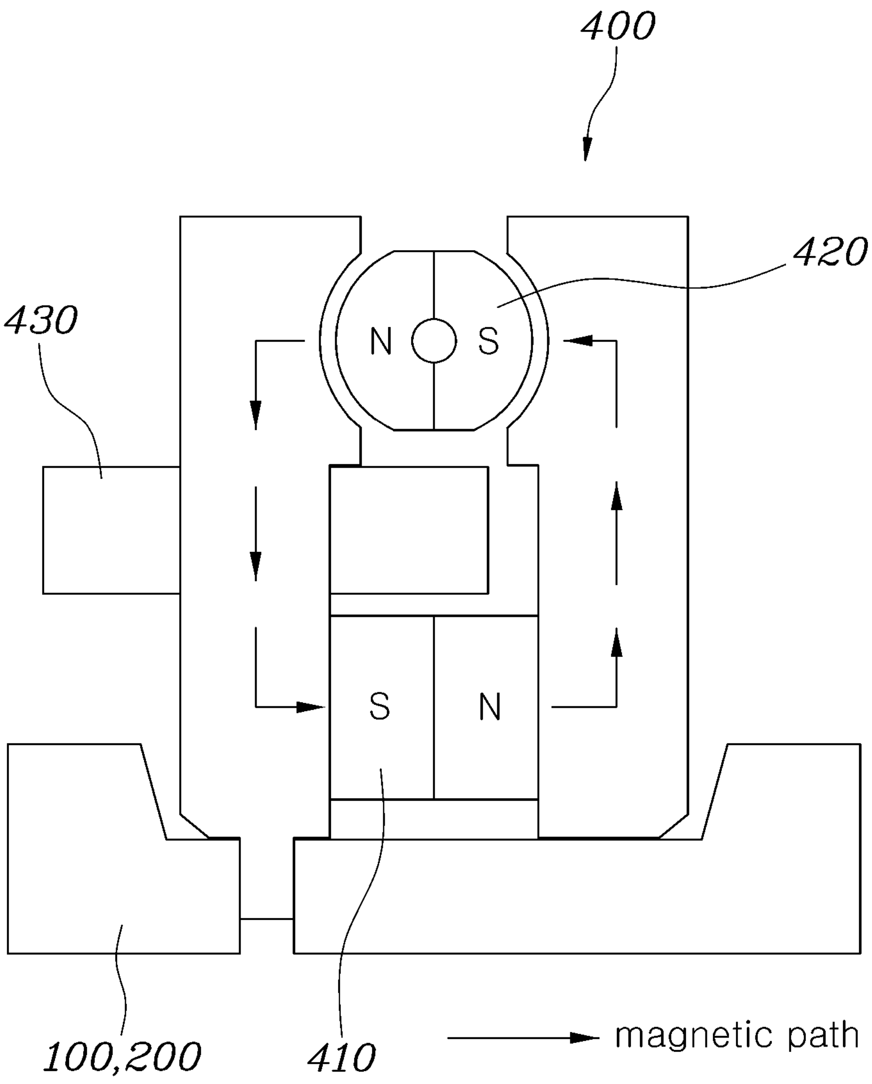

FIG. 2 is a perspective view showing the magnetic module provided in the vehicle body according to the embodiment of the present disclosure, and FIG. 3 and FIG. 4 are diagrams showing fixation and separation through the magnetic module according to the embodiment of the present disclosure.

First, referring to FIG. 2, the magnetic module 400 according to the embodiment of the present disclosure may include permanent magnets 410 and 420 and a coil 430. A plurality of permanent magnets 410 and 420 may be provided and, for example, may be formed of a square magnet 410 and a circular magnet 420. Current may be applied to the coil 430 of the magnetic module 400. When current is applied thereto, an external object in contact with the magnetic module 400 and the permanent magnets 410 and 420 selectively generate a magnetic field according to a flow of current flowing through the coil 430, thereby allowing the magnetic module 400 and the external object to be selectively fixed to each other or separated from each other.

For example, the magnetic module 400 may be provided in any one of the swappable interior part 300 and the floor frame 100, and the other one serving as an external object may be fixed to or separated from the magnetic module 400. In addition, the magnetic module 400 may be provided in any one of the swappable interior part 300 and the fixed interior part 200, and the other one serving as an external object may be fixed to or separated from the magnetic module 400. Detailed fixation and separation of the magnetic module 400 will be described with reference to FIG. 3 and FIG. 4.

FIG. 3 is a diagram showing the magnetic module 400 in a state of being fixed to the external object (for example, the floor frame 100 or the fixed interior part 200). Referring to FIG. 3, the square magnet 410 of the magnetic module 400 may be provided with fixed magnetic poles, and the circular magnet 420 may be rotatably provided. When the magnetic module 400 is fixed to the external object (the floor frame 100 or the fixed interior part 200), a magnetic field is generated in the magnetic module 400 due to current applied to the coil 430. Accordingly, the circular magnet 420 may be rotated so as to enable the same magnetic poles of the circular magnet 420 and the square magnet 410 to face each other.

As shown in FIG. 3, a magnetic path may be generated in the magnetic module 400 by magnetic pole arrangement of the square magnet 410 and the circular magnet 420. The magnetic path allows the magnetic module 400 to be reliably fixed to the external object (the floor frame 100 or the fixed interior part 200) by strongly contacting the external object.

FIG. 4 is a diagram showing the magnetic module 400 in a state of being separated from the external object (the floor frame 100 or the fixed interior part 200). Referring to FIG. 4, when the magnetic module 400 is separated from the external object (the floor frame 100 or the fixed interior part

200), the circular magnet 420 may be rotated by changing the current applied to the coil 430. Here, the circular magnet 420 may be rotated so as to enable the different magnetic poles of the circular magnet 420 and the square magnet 410 to face each other.

As shown in FIG. 4, a magnetic path may be generated in the magnetic module 400 by magnetic pole arrangement of the square magnet 410 and the circular magnet 420. Fixing force applied from the magnetic module 400 to the external object (the floor frame 100 or the fixed interior part 200) may be released by the generated magnetic path. Accordingly, the magnetic module 400 may be separated from the external object (the floor frame 100 or the fixed interior part 200).

Meanwhile, referring back to FIG. 2, the vehicle body may further include a controller 500 connected to the magnetic module 400 and configured to determine whether the magnetic module 400 is fixed between the swappable interior part 300 and the floor frame 100 or between the swappable interior part 300 and the fixed interior part 200. When a plurality of magnetic modules 400 are provided, a plurality of controllers 500 may be provided so as to correspond to the number of magnetic modules 400, or the controller 500 may be provided as a single unit connected to a plurality of magnetic modules.

Referring to FIG. 2, the magnetic module 400 may include a magnetic flux sensor 440 configured to measure the magnitude and direction of magnetic flux flowing through the magnetic module 400 according to the flow of the current flowing through the coil 430. The controller 500 may be connected to the magnetic flux sensor 440 and may determine whether the magnetic module 400 is fixed based on information measured by the magnetic flux sensor 440.

Hereinafter, mounting of the swappable interior part 300 will be described with reference to FIGS. 5 to 13 based on the above-described configuration.

First, a mounting process between the swappable interior part 300 and the floor frame 100 will be described with reference to FIGS. 5 to 10.

Figure 5:
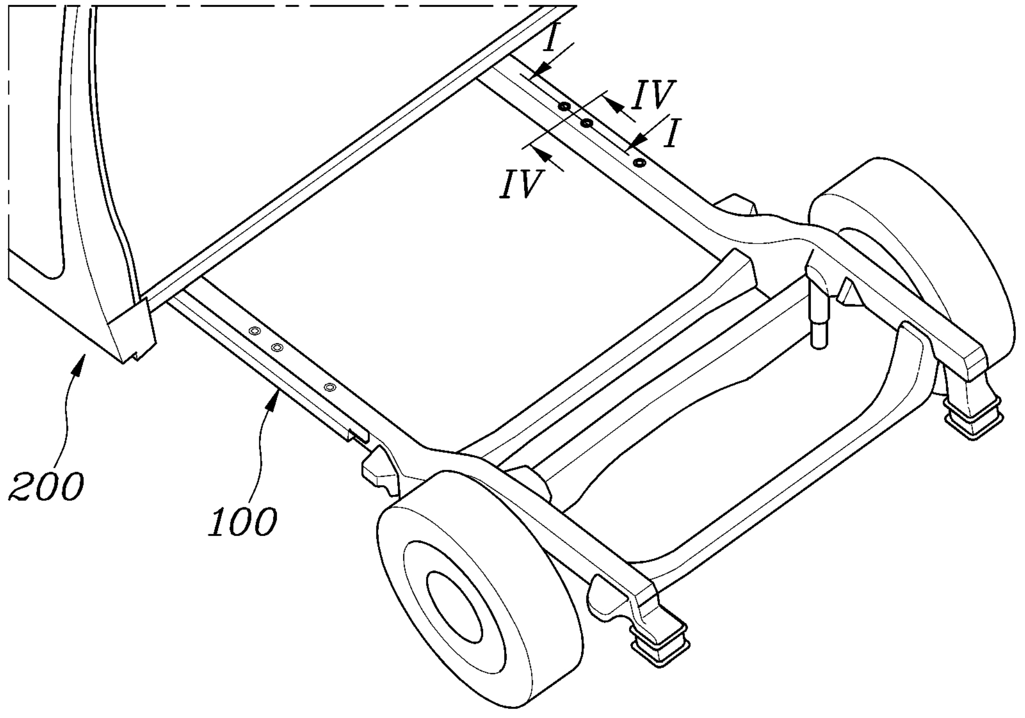
FIG. 5 is a diagram showing a floor frame of the vehicle body according to the embodiment of the present disclosure, as seen from above.

FIG. 5 is a diagram showing the floor frame of the vehicle body according to the embodiment of the present disclosure, as seen from above.

First, referring to FIG. 5, the swappable interior part 300 may be mounted on the floor frame 100. Specifically, the lower portion of the swappable interior part 300 may be mounted on the upper portion of the floor frame 100. In this case, a plurality of magnetic modules 400 may be provided to be spaced apart from each other along the edge of the swappable interior part 300 or the edge of the floor frame 100.

In addition, when the lower portion of the swappable interior part 300 is loaded on the upper portion of the floor frame 100, the swappable interior part 300 slides and moves from a loading point to a seating point located ahead of the loading point, and the lower portion of the swappable interior part 300 and the floor frame 100 may be fixed through the magnetic module 400 at the seating point. This process will be described with reference to FIGS. 6 to 10.

Figure 6:
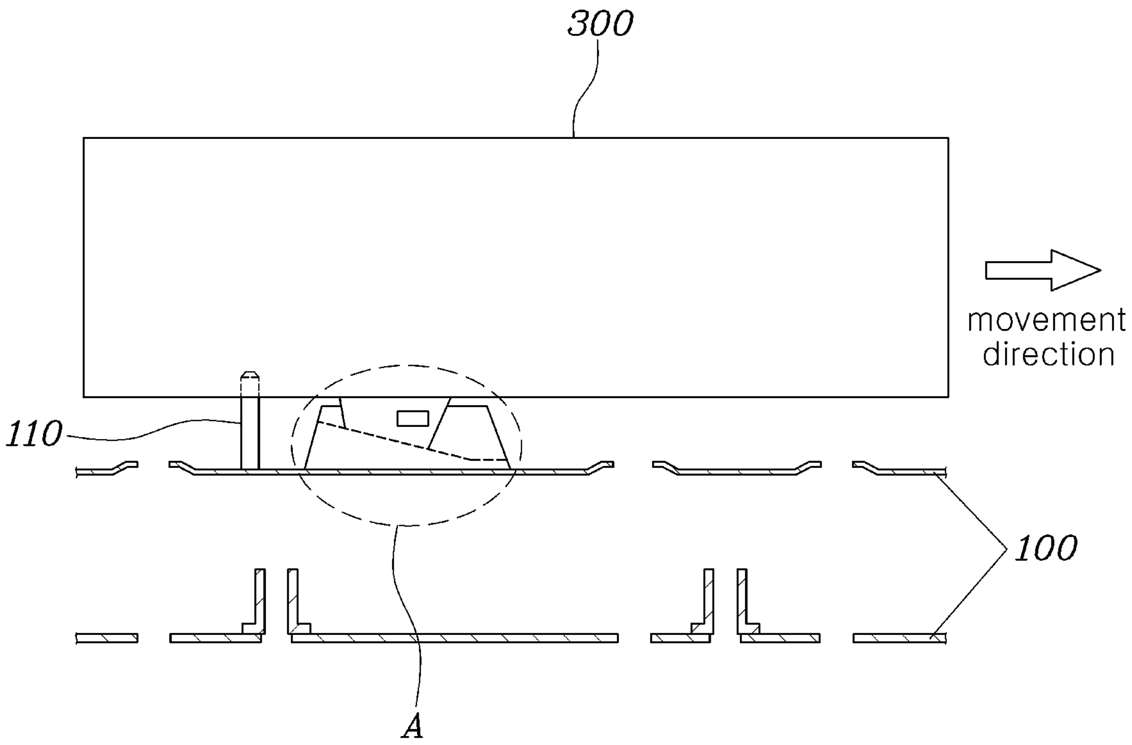
FIG. 6 is a cross-sectional view taken along line I-I in FIG. 5.
Figure 7:
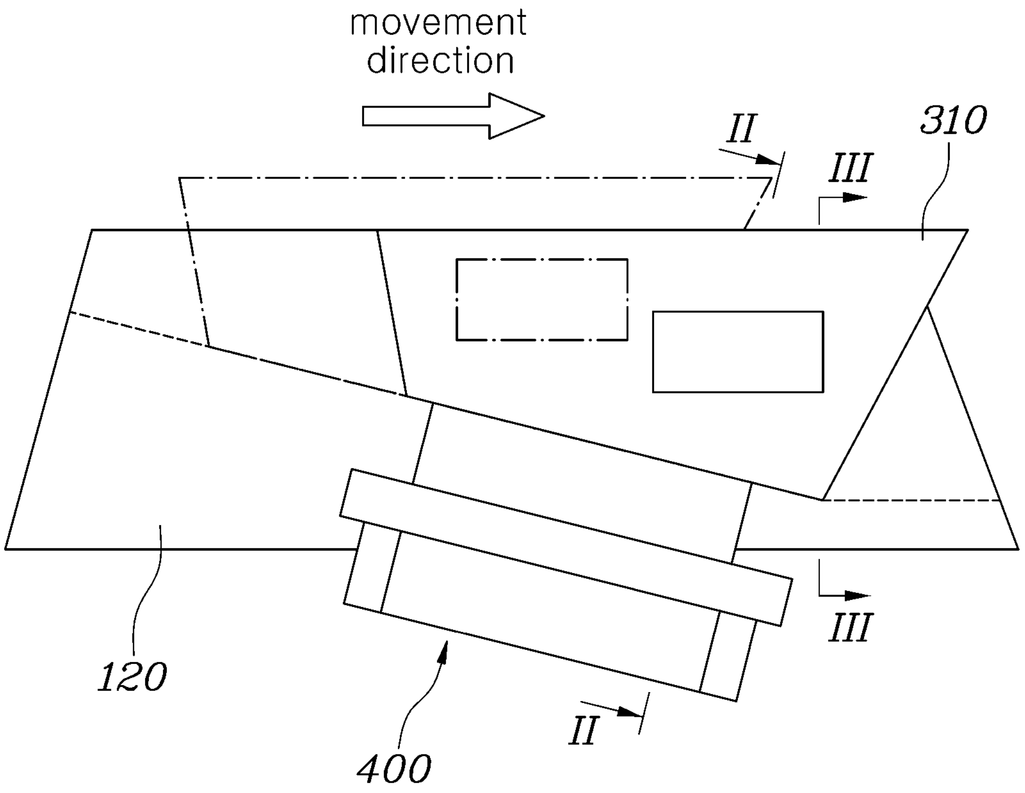
FIG. 7 is an enlarged view of a portion "A" in FIG. 6.
Figure 8:
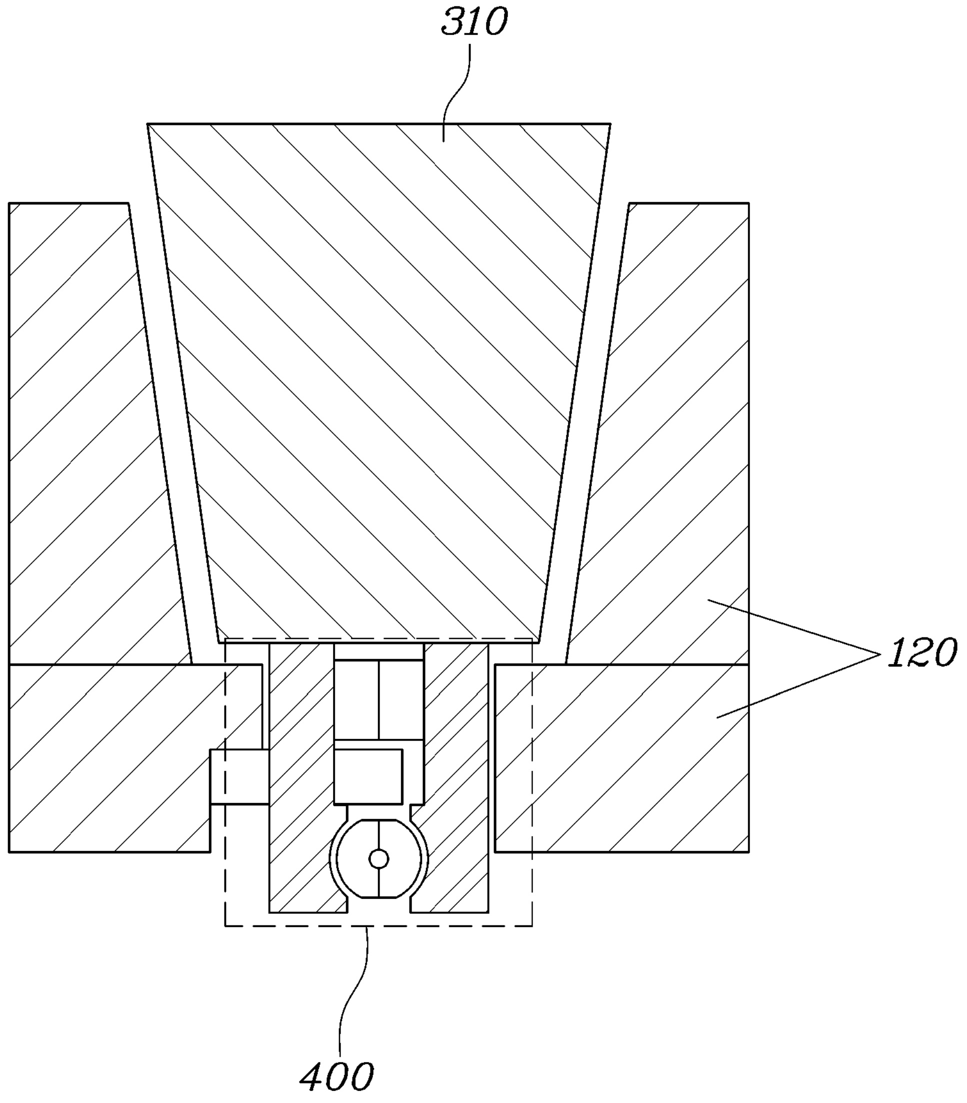
FIG. 8 is a cross-sectional view taken along line II-II in FIG. 7.
Figure 9A:
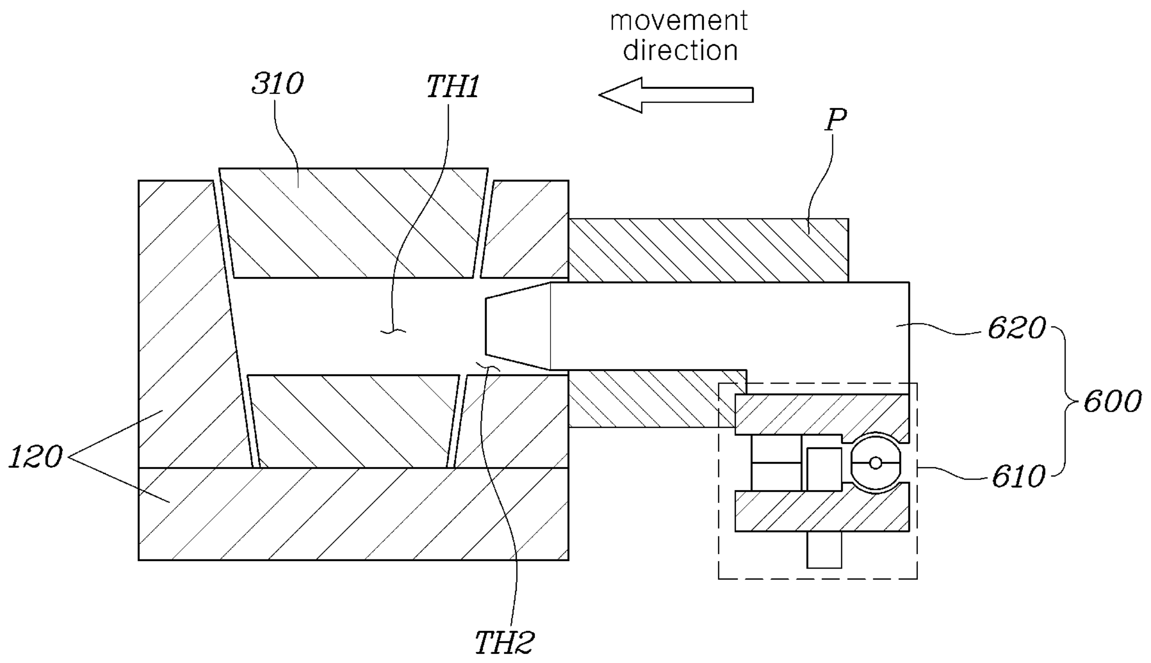
FIG. 9A and FIG. 9B are cross-sectional views taken along line III-III in FIG. 7.
Figure 9B:
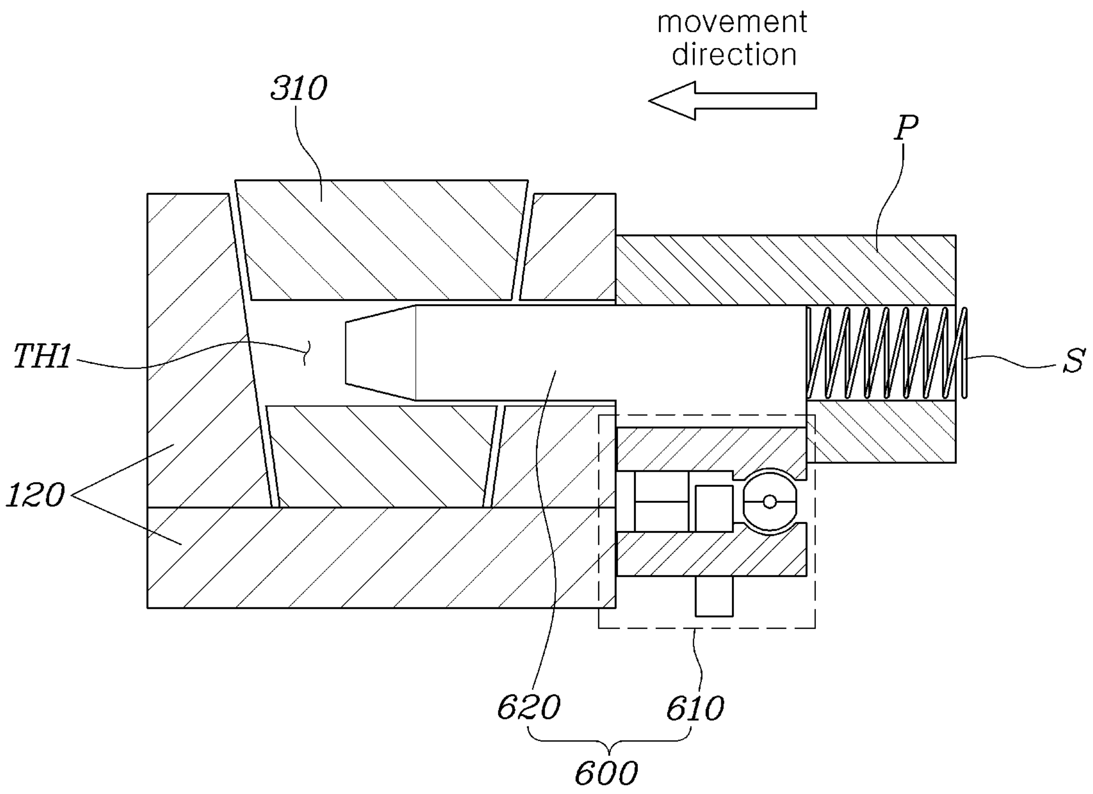
Figure 10:
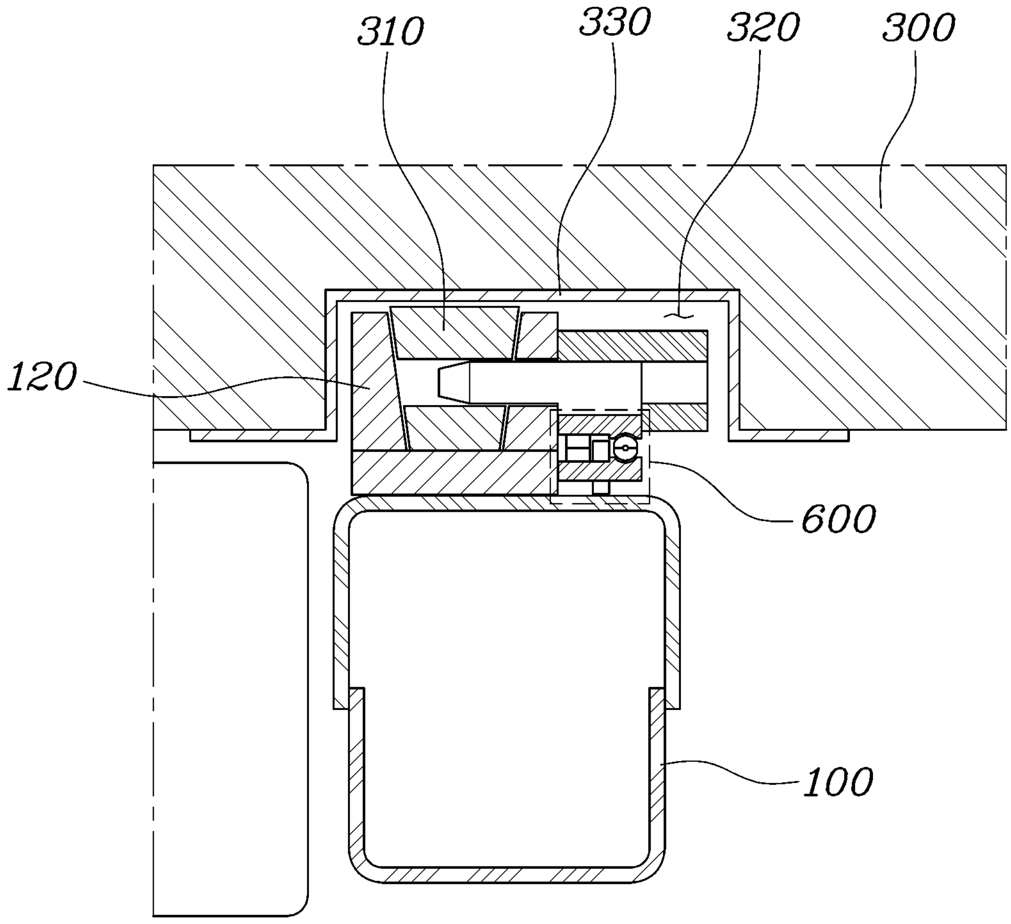
FIG. 10 is a cross-sectional view taken along line IV-IV in FIG. 5.

FIG. 6 is a cross-sectional view taken along line I-I in FIG. 5, FIG. 7 is an enlarged view of a portion "A" in FIG. 6, FIG. 8 is a cross-sectional view taken along line II-II in FIG. 7, FIG. 9A and FIG. 9B are cross-sectional views taken along line III-III in FIG. 7, and FIG. 10 is a cross-sectional view taken along line IV-IV in FIG. 5.

Referring to FIG. 6, the floor frame 100 may be provided with a first guidance pin 110 formed to protrude upwards therefrom, and the swappable interior part 300 may be provided with a slot hole (not shown) formed at the lower portion thereof and located in an area corresponding to a point at which the first guidance pin 110 is provided. When the lower portion of the swappable interior part 300 is loaded on the floor frame 100, the first guidance pin 110 may be inserted into the slot hole. Here, when the swappable interior part 300 moves, the inserted first guidance pin 110 may move along the slot hole. While the swappable interior part 300 moves, the first guidance pin 110 may be caught at the rear end of the slot hole, thereby preventing movement of the swappable interior part 300.

Furthermore, the swappable interior part 300 may have a fixed block 310 provided at the lower portion thereof. Particularly, the floor frame 100 may have a fixed block guide 120 provided at the upper portion thereof and located in an area corresponding to a point at which the fixed block 310 is provided. For example, when the lower portion of the swappable interior part 300 is loaded on the upper portion of the floor frame 100, the fixed block 310 may be loaded on the fixed block guide 120.

Referring to FIG. 7, when the swappable interior part 300 moves from the loading point at which the lower portion of the swappable interior part 300 is loaded on the upper portion of the floor frame 100 to the seating point, the fixed block 310 may move by sliding along the fixed block guide 120. In this manner, the swappable interior part 300 may slide and move. For example, a space may be provided in the fixed block guide 120 to allow the fixed block 310 to move in the fixed block guide 120, and an inclined surface may be formed in the space. Accordingly, the fixed block 310 may slide and move along the inclined surface formed on the fixed block guide 120 due to gravity.

Referring to FIG. 8, the magnetic module 400 may be provided at the lower portion of the inclined surface formed on the fixed block guide 120. The magnetic module 400 may be attached to the fixed block 310 that slides along the inclined surface and moves up to the seating point. Here, the magnetic module 400 is fixed to the fixed block 310, and the swappable interior part 300 may be mounted on the floor frame 100. Since the fixing of the magnetic module 400 has been described in detail with reference to FIG. 3 and FIG. 4, a description thereof is omitted.

Meanwhile, when the fixed block 310 is fixed through the magnetic module 400, the fixed block 310 may be additionally fixed through a side magnetic module 600. For example, the side magnetic module 600 may be inserted into the fixed block 310 in the width direction of the vehicle and, as such, the fixed block 310 may be additionally fixed. The above-described fixing process will be described with reference to FIG. 9A and FIG. 9B.

Referring to FIG. 9A and FIG. 9B, the side magnetic module 600 may be provided on the side of the fixed block guide 120 and located at a predetermined distance away from the fixed block guide 120. The side magnetic module 600 may include an attachment part 610 and a second guidance pin 620. The attachment part 610 may include permanent magnets and a coil. For example, the attachment part 610 has the same configuration as that of the magnetic module 400 and may perform the same function. However, this configuration is an example and is not necessarily limited thereto.

Additionally, the second guidance pin 620 may extend from the side of the attachment part 610 in the width direction of the vehicle. The second guidance pin 620 may be inserted into the fixed block 310 to fix the fixed block 310. To this end, the fixed block 310 may have a first through hole TH1 provided therein and formed to penetrate the opposite sides of the fixed block 310.

In addition, a second through hole TH2 may be formed on one side of the opposite sides of the fixed block guide 120, in which the side magnetic module 600 is located on the one side of the fixed block guide 120. Referring to FIG. 9A, one end of the second guidance pin 620 of the side magnetic module 600 may be located on the second through hole TH2, which means that the second guidance pin 620 may be located on the second through hole TH2 without being inserted into the fixed block 310 until the fixed block 310 is fixed.

Thereafter, when the fixed block 310 is fixed through the magnetic module 400 provided at the lower portion of the fixed block guide 120, as shown in FIG. 9B, the second guidance pin 620 of the side magnetic module 600 may be inserted into the first through hole TH1 of the fixed block 310. Specifically, when the fixed block 310 is fixed through the magnetic module 400, the first through hole TH1 of the fixed block 310 and the second through hole TH2 of the fixed block guide 120 may be aligned on the same line, thereby forming a passage through which the second guidance pin 620 may move. Accordingly, the end of the second guidance pin 620 may be inserted into the fixed block 310 by moving from the second through hole TH2 to the first through hole TH1.

Further, when the first through hole TH1 and the second through hole TH2 are aligned on the same line, the attachment part 610 of the side magnetic module 600 may move toward the fixed block guide 120 by magnetic force of the permanent magnets included in the attachment part 610, thereby contacting the side of the fixed block guide 120. Additionally, according to a flow of current flowing through the coil included in the attachment part 610, the permanent magnets of the attachment part 610 selectively generate a magnetic field, thereby enabling the fixed block guide 120 and the attachment part 610 to be selectively fixed to each other or separated from each other.

Additionally, referring to FIG. 9A and FIG. 9B, a guidance plate P may be provided on the side of the fixed block guide 120, in which the second through hole TH2 is formed on the side. One end of the guidance plate P may be connected to the side of the fixed block guide 120 where the second through hole TH2 is formed, thereby covering the second guidance pin 620 of the side magnetic module 600. Accordingly, the second guidance pin 620 may move along the guidance plate P so as to be inserted into the first through hole TH1 of the fixed block 310.

Further, referring to FIG. 9B, a spring S may be connected to the end of the second guidance pin 620. When the attachment part 610 moves to the side of the fixed block guide 120 and is fixed to the fixed block guide 120, the spring S may be stretched and generate elastic force. However, at this time, fixing force between the attachment part 610 and the fixed block guide 120 is stronger than elastic force that allows the spring S to return to the original shape thereof, thereby allowing the attachment part 610 to be maintained in contact with the fixed block guide 120. When the fixing force between the attachment part 610 and the fixed block guide 120 disappears, the spring S may move the second guidance pin 620 of the side magnetic module 600 rearwards using the elastic force that allows the spring S to return to the original shape thereof. As a result, a coupling state between the side magnetic module 600 and the fixed block 310 may be released.

Meanwhile, referring to FIG. 10, the fixed block guide 120 and the side magnetic module 600 may be provided on the upper portion of the floor frame 100. Accordingly, interference may occur when the swappable interior part 300 is loaded on the floor frame 100. To solve this problem, the swappable interior part 300 has an indented portion 320 formed at the lower portion thereof and configured to cover the fixed block guide 120 and the side magnetic module 600. In addition, the fixed block 310 is provided in the indented portion 320, thereby making it possible to perform, in the indented portion 320, coupling between the fixed block 310 and the fixed block guide 120 or the fixed block 310 and the side magnetic module 600. Therefore, it is necessary to secure sufficient rigidity and strength in the indented portion 320. To this end, a reinforcing bracket 330 may be provided on the inner surface of the indented portion 320 formed to be indented inwards. Rigidity and strength of the indented portion 320 may be secured through the reinforcing bracket 330.

In addition, referring back to FIG. 5, when the swappable interior part 300 is mounted on the floor frame 100, the magnetic module 400 and the side magnetic module 600 may allow the swappable interior part 300 and the floor frame 100 to be fixed to each other at a neighboring point of a location at which the fixed interior part 200 of the floor frame 100 is mounted, at a rear point of the floor frame 100, and at an intermediate point between the neighboring point and the rear point. For example, when the swappable interior part 300 is seated on the floor frame 100, the magnetic module 400 and the side magnetic module 600 provided at the neighboring point may first fix the floor frame 100 and the swappable interior part 300. Thereafter, the magnetic module 400 and the side magnetic module 600 provided at the rear point may fix the floor frame 100 and the swappable interior part 300. When the magnetic module 400 and the side magnetic module 600 are fixed at the neighboring point and the rear point, the magnetic module 400 and the side magnetic module 600 may fix the floor frame 100 and the swappable interior part 300 at the intermediate point between the neighboring point and the rear point. However, it is understood that this is an example, and the present disclosure is not necessarily limited thereto. For example, it is possible to change the order of the points at which the floor frame 100 and the swappable interior part 300 are fixed to each other. According to the order of the neighboring point, the rear point, and the intermediate point, the magnetic module 400 may first fix the floor frame 100 and the swappable interior part 300, and then the side magnetic module 600 may additionally fix the floor frame 100 and the swappable interior part 300.

Next, a description will be given as to installation between the swappable interior part 300 and the fixed interior part 200 with reference to FIGS. 11 to 13.

Figure 11:
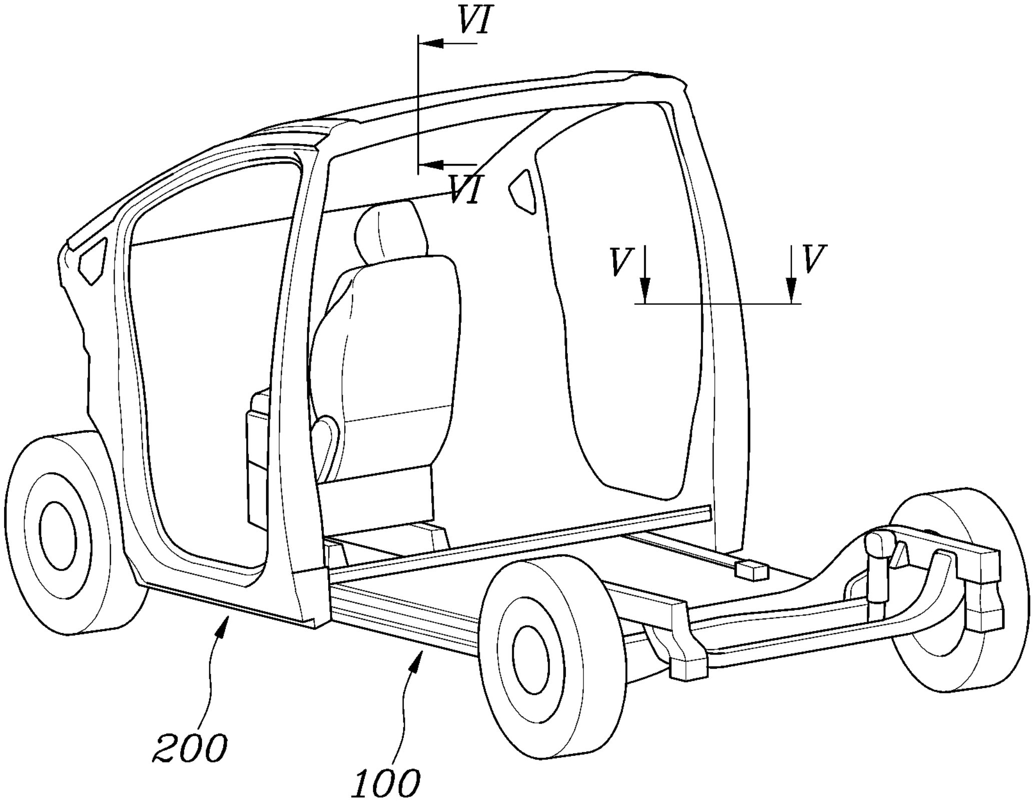
FIG. 11 is a diagram showing a fixed interior part of the vehicle body according to the embodiment of the present disclosure, as seen from the rear.

FIG. 11 is a diagram showing the fixed interior part of the vehicle body according to the embodiment of the present disclosure, as seen from the rear.

First, referring to FIG. 11, the swappable interior part 300 may be mounted on the fixed interior part 200. Specifically, one side of the swappable interior part 300 may be mounted on at least one pillar member of the fixed interior part 200. In this case, a plurality of magnetic modules 400 may be provided to be spaced apart from each other along the edge of the swappable interior part 300 or the edge of the fixed interior part 200.

Further, when the lower portion of the swappable interior part 300 is loaded on the upper portion of the floor frame 100, and then the swappable interior part 300 moves by sliding from the loading point to the seating point, one side of the swappable interior part 300 moves toward the fixed interior part 200 to contact the same, and one side of the swappable interior part 300 and the fixed interior part 200 may be fixed to each other through the magnetic module 400. This fixing process will be described reference to FIG. 12 and FIG. 13.

Figure 12:
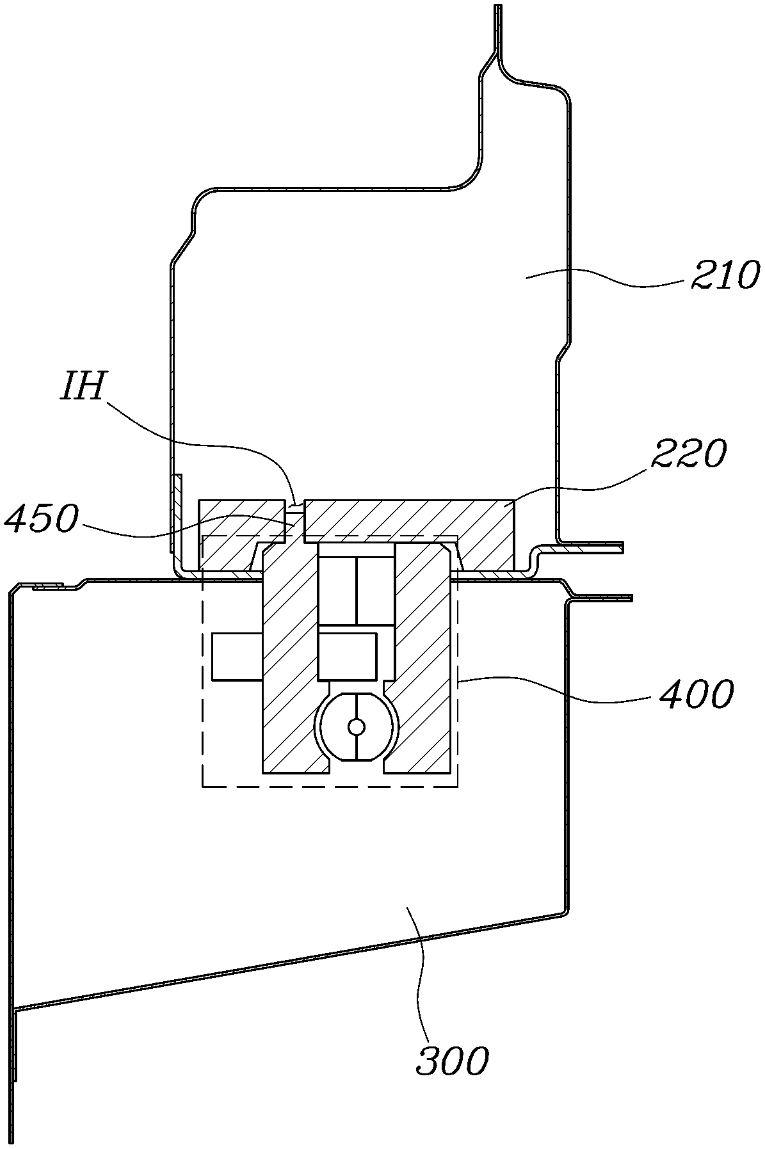
FIG. 12 is a cross-sectional view taken along line V-V in FIG. 11.
Figure 13:
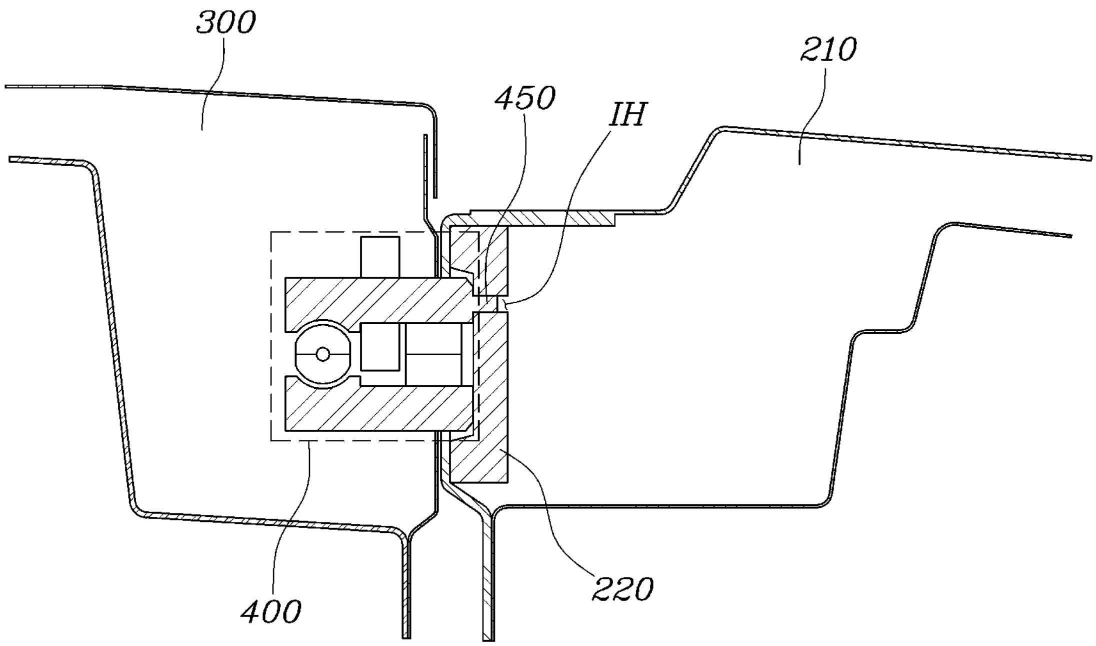
FIG. 13 is a cross-sectional view taken along line VI-VI in FIG. 11.

Referring to FIG. 12 and FIG. 13, the magnetic module 400 may be provided in any one of one side of the swappable interior part 300 and a pillar member 210 of the fixed interior part 200, and the other one may have a seating part provided therein and configured to allow the magnetic module 400 to be seated thereon. For example, in the following description, it is assumed that the magnetic module 400 is mounted in one side of the swappable interior part 300, and a seating part 220 is provided in the pillar member 210 of the fixed interior part 200.

When the swappable interior part 300 is mounted on the floor frame 100 and moves by sliding the floor frame 100, one side of the swappable interior part 300 may move toward the pillar member 210 of the fixed interior part 200. Since the magnetic module 400 is mounted on one side of the swappable interior part 300, one side of the swappable interior part 300 moving toward the pillar member 210 may contact the pillar member 210 by the magnetic module 400. Thereafter, according to a flow of current flowing through the coil 430 of the magnetic module 400, the swappable interior part 300 may selectively apply fixing force toward the pillar member 210. Since this process has been described above with reference to FIG. 3 and FIG. 4, a description thereof is omitted.

In addition, the magnetic module 400 may have a protrusion 450 formed at an end thereof, in which the end is seated on the seating part 220. The seating part 220 may have an insertion hole IH configured to allow the protrusion 450 to be inserted thereinto. According to this configuration, when one side of the swappable interior part 300 moves toward the pillar member 210 of the fixed interior part 200, the protrusion 450 may move along the seating part 220 so as to be inserted into the insertion hole IH, and the seating position of the magnetic module 400 may be fixed when the protrusion 450 is inserted into the insertion hole IH.

Meanwhile, referring back to FIG. 11, when the swappable interior part 300 is mounted on the fixed interior part 200, the magnetic module 400 enables the swappable interior part 300 and the fixed interior part 200 to be fixed to each other at a lower point of the pillar member 210 of the fixed interior part 200, an upper point thereof, and an intermediate point between the lower point and the upper point. For example, when the swappable interior part 300 is seated on the fixed interior part 200, the magnetic module 400 provided at the lower point may first fix the fixed interior part 200 and the swappable interior part 300. Thereafter, the magnetic module 400 provided at the upper point may fix the fixed interior part 200 and the swappable interior part 300. When the magnetic module 400 is fixed at the upper and lower points, the magnetic module 400 may fix the fixed interior part 200 and the swappable interior part 300 at the intermediate point between the upper point and the lower point. However, it is understood that this process is an example, and the present disclosure is not necessarily limited thereto. For example, it is possible to change the order of fixing the fixed interior part 200 and the swappable interior part 300.

Hereinafter, the mounting process of the swappable interior part 300 according to the embodiment of the present disclosure will be described with reference to FIG. 14. For example, in FIG. 14, it is assumed that a control logic is performed in the controller 500 described above.

Figure 14:
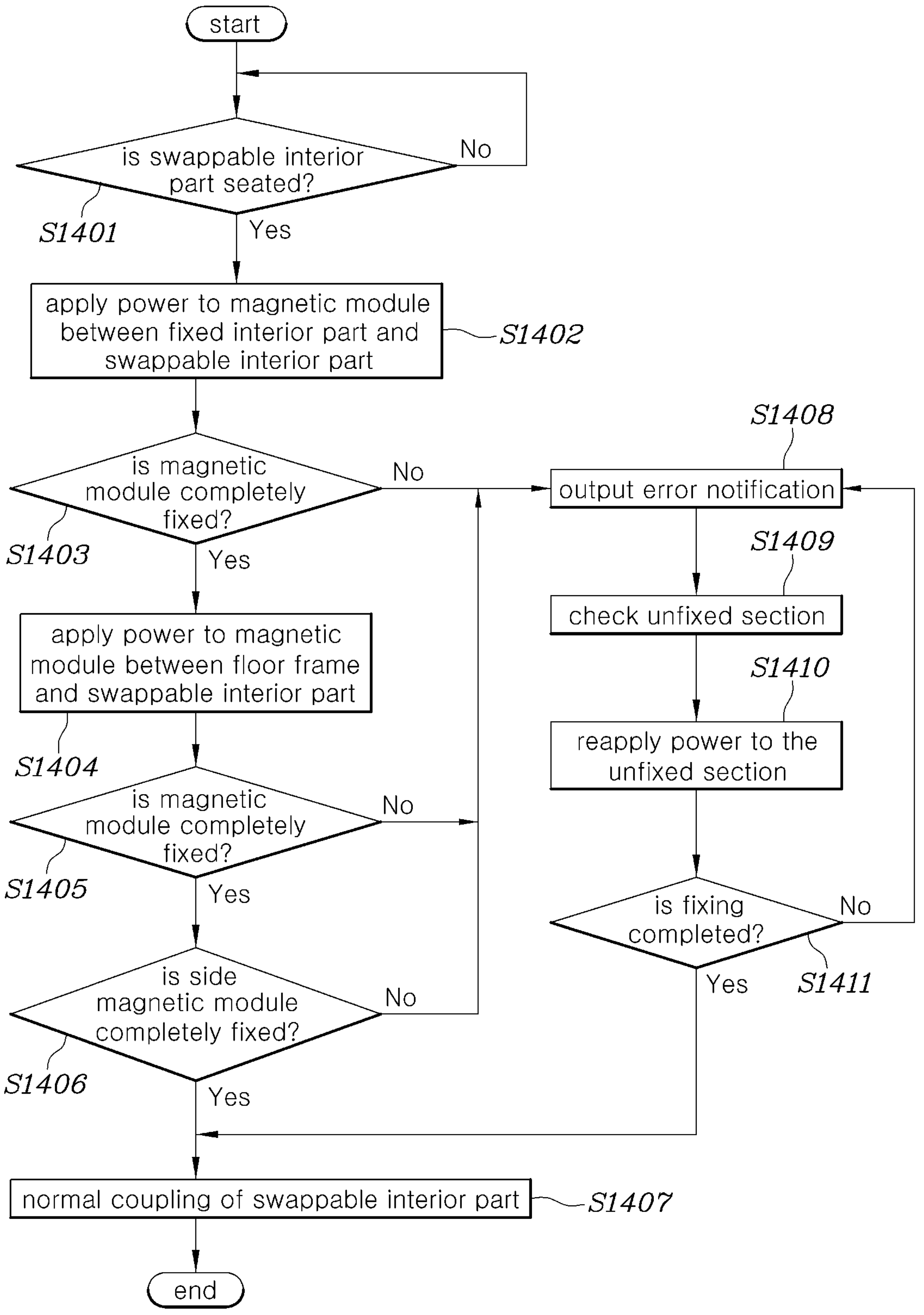
FIG. 14 is a flowchart showing a mounting process of a swappable interior part according to the embodiment of the present disclosure.

FIG. 14 is a flowchart showing the mounting process of the swappable interior part according to the embodiment of the present disclosure.

Referring to FIG. 14, when the swappable interior part 300 is loaded and seated (Yes in S1401), the controller 500 may allow power to be applied to the magnetic module 400 disposed between the fixed interior part 200 and the swappable interior part 300. (S1402). After power is applied thereto, the controller 500 may determine, using the magnetic flux sensor 440 of the magnetic module 400, whether the magnetic module 400 is fixed (S1403). When the magnetic module 400 is fixed (Yes in S1403), the controller 500 may allow power to be applied to the magnetic module 400 between the floor frame 100 and the swappable interior part 300 (S1404).

After power is applied thereto, the controller 500 may determine, using the magnetic flux sensor 440 of the magnetic module 400, whether the magnetic module 400 is fixed (S1405). When the magnetic module 400 is fixed (Yes in S1405), the controller 500 may determine whether the side magnetic module 600 is fixed by applying power to the side magnetic module 600 (S1406). When fixing of the side magnetic module 600 is completed (Yes in S1406), the controller 500 may determine that the swappable interior part 300 is normally coupled to the floor frame 100 and the fixed interior part 200 (S1407).

On the other hand, when the magnetic module 400 is not fixed (No in S1403, No in S1405, and No in S1406), the controller 500 may determine that there is a problem with coupling therebetween and output an error notification (S1408). Thereafter, the controller 500 may check a section in which the magnetic module 400 or the side magnetic module 600 is not fixed based on the error notification (S1409). The controller 500 may reapply power to the magnetic module 400 or the side magnetic module 600 present in the checked section (S1410). After reapplying power thereto, the controller 500 determines whether the magnetic module 400 or the side magnetic module 600 is fixed (S1411). When the magnetic module 400 or the side magnetic module 600 is fixed (Yes in S1411), the controller 500 may determine that the swappable interior part 300 is normally coupled to the floor frame 100 and the fixed interior part 200 (S1407).

FIG. 14 shows that step S1404 is performed after step S1402, but it goes without saying that this process is an example and the present disclosure is not necessarily limited thereto. For example, step S1404 may be performed first, and then step S1402 may be performed.

According to the above description, a swappable interior part of a vehicle body of the present disclosure is easily separable and replaceable using a magnetic module.

Additionally, deformation of the vehicle body at an assembly point may be minimized using the magnetic module.

Further, an assembly structure using not only the magnetic module but also a plurality of guidance pins is applied to the present disclosure, thereby making it possible to secure fixing force of the swappable interior part and minimize assembly tolerance.

As is apparent from the above description, the present disclosure provides a vehicle body including a magnetic module configured to allow a swappable interior part to be easily separable and replaceable.

Additionally, the magnetic module is adopted to minimize deformation of the vehicle body at an assembly point.

Further, an assembly structure using a plurality of guidance pins as well as the magnetic module is applied to the present disclosure, thereby making it possible to secure fixing force of the swappable interior part and minimize assembly tolerance.

The effects of the present disclosure are not limited to the above-mentioned effects, and other effects not mentioned will be clearly understood by those skilled in the art from the detailed description of the embodiments.

Although the preferred embodiments of the present disclosure have been disclosed for illustrative purposes, those skilled in the art will appreciate that various modifications, additions, and substitutions are possible, without departing from the scope and spirit of the disclosure as disclosed in the accompanying claims.

The present disclosure is implementable as computer-readable code in a medium in which a program is recorded. A computer-readable medium includes all types of recording devices that store data readable by a computer system. Examples of the computer-readable media include a hard disk drive (HDD), a solid state drive (SSD), a silicon disk drive (SSD), a ROM, a RAM, a CD-ROM, a magnetic tape, a floppy disk, an optical data storage device, and the like. Accordingly, the above detailed description should not be interpreted in all respects in a limited manner and should be considered illustrative. The scope of the present disclosure should be determined by reasonable interpretation of the appended claims, and all modifications within the equivalent scope of the present disclosure are included within the scope of the present disclosure.

The invention claimed is:

1. A vehicle body comprising:

a floor frame configured to allow driving parts of a vehicle and wheels of the vehicle to be mounted on the floor frame;

a fixed interior part mounted on and fixed to the floor frame;

a swappable interior part having a lower portion detachably mounted on the floor frame and having one side detachably mounted on the fixed interior part, wherein the swappable interior part is replaceable depending on a use of the vehicle; and a magnetic module positioned between the swappable interior part and the floor frame or between the swappable interior part and the fixed interior part, the magnetic module being configured to apply a fixing force to the swappable interior part according to a flow of current flowing through a coil;

wherein the magnetic module comprises a permanent magnet and the coil, and an external object in contact with the permanent magnet of the magnetic module and the permanent magnet generate a magnetic field according to the flow of the current flowing through the coil, thereby allowing the magnetic module and the external object to be fixed to each other or separated from each other.

2. The vehicle body according to claim 1, wherein the magnetic module is positioned in any one of the swappable interior part and the floor frame, and the other of the swappable interior part and the floor frame serving as the external object is fixed to the magnetic module or separated from the magnetic module.

3. The vehicle body according to claim 1, wherein the magnetic module is positioned in any one of the swappable interior part and the fixed interior part, and the other of the swappable interior part and the fixed interior part serving as the external object is fixed to the magnetic module or separated from the magnetic module.

4. The vehicle body according to claim 1, wherein a plurality of magnetic modules are provided to be spaced apart from each other along an edge of the floor frame, the fixed interior part, or the swappable interior part.

5. The vehicle body according to claim 1, wherein the swappable interior part slides and moves, in response that the lower portion of swappable interior part being loaded on an upper portion of the floor frame, from a loading point to a seating point located ahead of the loading point, and the lower portion of the swappable interior part and the floor frame are fixed to each other at the seating point through the magnetic module.

6. The vehicle body according to claim 5, wherein the floor frame has a first guidance pin protruding upwards from the floor frame, the swappable interior part has a slot hole provided at the lower portion of the swappable interior part, wherein the slot hole is located in an area corresponding to a point having the first guidance pin, the first guidance pin is inserted into the slot hole when the lower portion of the swappable interior part is loaded on the floor frame, the inserted first guidance pin moves along the slot hole when the swappable interior part moves, and movement of the swappable interior part is prevented when the first guidance pin is caught at a rear end of the slot hole.

7. The vehicle body according to claim 5, wherein the swappable interior part has a fixed block provided at the lower portion, the floor frame has a fixed block guide provided in an area corresponding to a point having the fixed block, and the fixed block is loaded on the fixed block guide and moves by sliding along the fixed block guide from the loading point to the seating point.

8. The vehicle body according to claim 7, wherein the fixed block guide has a moving space defined therein and configured to allow the fixed block to be slidable and movable within the moving space, the magnetic module is provided at a lower portion of the moving space, and the magnetic module is attached to the fixed block moving to the seating point to fix the fixed block.

9. The vehicle body according to claim 8, wherein the fixed block guide has a side magnetic module provided on a side of the fixed block guide and located at a predetermined distance away from the fixed block guide, and the side magnetic module is inserted into the fixed block in a width direction of the vehicle when the fixed block is fixed through the magnetic module at the seating point, thereby further fixing the fixed block.

10. The vehicle body according to claim 9, wherein the fixed block guide and the side magnetic module are provided at the upper portion of the floor frame, the swappable interior part has an indented portion provided at the lower portion and indented inwards to cover the fixed block guide and the side magnetic module, and the indented portion has a reinforcing bracket provided on an inner surface.

11. The vehicle body according to claim 9, wherein the side magnetic module comprises an attachment part comprising a permanent magnet and a coil, and a second guidance pin extending in the width direction of the vehicle from a side of the attachment part, the fixed block has a first through hole formed to penetrate opposite sides, and the second guidance pin of the side magnetic module is inserted into the first through hole of the fixed block to further fix the fixed block.

12. The vehicle body according to claim 11, wherein the fixed block guide has a second through hole formed on one side of the opposite sides, wherein the side magnetic module is located on the one side, one end of the second guidance pin of the side magnetic module is located in the second through hole, and the first through hole and the second through hole are aligned, when the fixed block moves to the seating point, on a same line to allow the second guidance pin to be inserted into the first through hole.

13. The vehicle body according to claim 12, wherein the attachment part moves, when the first through hole and the second through hole are aligned on the same line, by magnetic force of the permanent magnet to contact the one side of the fixed block guide, and the permanent magnet of the attachment part generates a magnetic field according to a flow of current flowing through the coil, thereby allowing the fixed block guide and the attachment part to be fixed to each other or separated from each other.

14. The vehicle body according to claim 12, wherein the one side having the second through hole of the fixed block guide has a guidance plate, wherein the guidance plate has one end connected to the one side and configured to cover the second guidance pin of the side magnetic module, and the second guidance pin moves along the guidance plate to be inserted into the first through hole.

15. The vehicle body according to claim 5, wherein the one side of the swappable interior part moves toward a pillar member of the fixed interior part when the lower portion of the swappable interior part slides and moves from the loading point to the seating point.

16. The vehicle body according to claim 15, wherein the magnetic module is positioned in any one of the one side of the swappable interior part and the pillar member of the fixed interior part, the other of the swappable interior part and the pillar member has a seating part configured to allow the magnetic module to be seated thereon, and the magnetic module is seated on the seating part when the one side of the swappable interior part moves toward the pillar member of the fixed interior part, thereby allowing the one side of the swappable interior part to be fixed to the pillar member of the fixed interior part.

17. The vehicle body according to claim 16, wherein the magnetic module has a protrusion formed at an end, wherein the end is seated on the seating part, the seating part has an insertion hole configured to allow the protrusion to be inserted thereinto, and the protrusion is inserted into the insertion hole when the one side of the swappable interior part is mounted on the pillar member of the fixed interior part, thereby fixing a seating position of the magnetic module.

18. The vehicle body according to claim 1, further comprising a controller connected to the magnetic module and configured to determine whether the magnetic module is fixed between the swappable interior part and the floor frame, or between the swappable interior part and the fixed interior part.

19. The vehicle body according to claim 18, wherein the magnetic module comprises a magnetic flux sensor, the magnetic flux sensor is configured to measure a magnitude and a direction of magnetic flux flowing through the magnetic module according to the flow of the current flowing through the coil, and the controller is connected to the magnetic flux sensor and configured to determine, based on information measured by the magnetic flux sensor, whether the magnetic module is fixed.

20. A vehicle body comprising:

a floor frame configured to allow driving parts of a vehicle and wheels of the vehicle to be mounted on the floor frame;

a fixed interior part mounted on and fixed to the floor frame;

a swappable interior part having a lower portion detachably mounted on the floor frame and having one side detachably mounted on the fixed interior part, wherein the swappable interior part is replaceable depending on a use of the vehicle; and a magnetic module positioned between the swappable interior part and the floor frame or between the swappable interior part and the fixed interior part, the magnetic module being configured to apply a fixing force to the swappable interior part according to a flow of current flowing through a coil;

wherein the swappable interior part slides and moves, in response that the lower portion of swappable interior part being loaded on an upper portion of the floor frame, from a loading point to a seating point located ahead of the loading point, and the lower portion of the swappable interior part and the floor frame are fixed to each other at the seating point through the magnetic module.

* * * * *